United States Patent
Ogura et al.

(10) Patent No.: US 6,565,956 B2
(45) Date of Patent: May 20, 2003

(54) MULTILAYER CERAMIC WIRING BOARD AND PROCESS FOR PRODUCING SAME

(75) Inventors: Takashi Ogura, Kyotanabe (JP); Shigehiro Horimoto, Kyotanabe (JP); Masanori Hongo, Hirakata (JP)

(73) Assignees: Sanyo Electric Co., Ltd., Moriguchi (JP); Sanyo Electric Components, Ltd., Daito (JP)

( * ) Notice: Subject to any disclaimer, the term of this patent is extended or adjusted under 35 U.S.C. 154(b) by 0 days.

(21) Appl. No.: 09/994,765

(22) Filed: Nov. 28, 2001

(65) Prior Publication Data

US 2002/0094423 A1 Jul. 18, 2002

(30) Foreign Application Priority Data

Nov. 30, 2000 (JP) .................................. 2000-364471
Nov. 30, 2000 (JP) .................................. 2000-364652

(51) Int. Cl.$^7$ ................................................ B32B 3/00
(52) U.S. Cl. ..................... 428/210; 428/901; 156/89.12; 156/89.16
(58) Field of Search .................... 428/210, 901; 156/89.16, 89.12

(56) References Cited

U.S. PATENT DOCUMENTS 5,147,484 A  *  9/1992  Chance et al. .............. 156/89
5,514,451 A  *  5/1996  Kumar et al. ................ 428/210
5,858,145 A  *  1/1999  Sreeram et al. ........... 156/89.16

* cited by examiner

Primary Examiner—Cathy Lam
(74) Attorney, Agent, or Firm—Armstrong, Westerman & Hattori, LLP

(57) ABSTRACT

A multilayer ceramic wiring board prepared from a plurality of sheets formed from a ceramic-incorporating material containing a ceramic powder and a binder resin and each having a pattern of one or a plurality of circuit elements printed on a surface thereof with use of a conductive mixture material containing an electrically conductive powder and a binder resin, by placing the sheets over one another to form a laminate, and compressing and firing the laminate. The mean particle size Rs of the ceramic powder is not greater than the value of (Rd−σd) wherein Rd is the mean particle size of the conductive powder, and σd is the standard deviation obtained when the distribution of the particle sizes of the conductive powder is expressed by a normal distribution function. This feature prevents formation of projections which would otherwise extend from the surface of one circuit element toward another circuit element when the elements are formed by firing the laminate.

4 Claims, 18 Drawing Sheets

MULTILAYER CERAMIC WIRING BOARD AND PROCESS FOR PRODUCING SAME

FIELD OF THE INVENTION

The present invention relates to multilayer ceramic wiring boards for providing various electronic circuits for use in electronic devices such as portable telephones, and to processes for producing such wiring boards.

BACKGROUND OF THE INVENTION

With compact electronic devices such as portable telephones, it is conventional practice to arrange a plurality of circuit elements constituting the device into a multilayer ceramic wiring board, as integrated into a single chip and mount the wiring board on the main substrate.

As shown in FIG. 19, the multilayer ceramic wiring board comprises superposed ceramic layers 7 each having a plurality of circuit elements 71 formed on the surface thereof and providing an inductor or capacitor. Such circuit elements 71 are interconnected by a continuity channel (hereinafter referred to as a "via hole") 73 extending through the ceramic layer 7 to provide an electric circuit such as a filter.

In producing the multilayer ceramic wiring board, sheets (hereinafter referred to as "green sheets") comprising a ceramic-incorporating material which contains a ceramic powder and a binder resin are prepared first by coating a surface of a plastic film with the ceramic-incorporating material in the form of a sheet and drying the material. A pattern of circuit elements in accordance with the design of the contemplated electronic circuit is subsequently printed on the surface of each green sheet using a conductive mixture material containing an electrically conductive powder and a binder resin. The printed green sheets are then placed over one another to prepare a laminate, which is thereafter pressed hot and thereby consolidated. The pressed laminate is further fired, and the fired laminate is finally cut into a plurality of multilayer ceramic wiring boards.

In recent years, it is required with increasing severity to compact electronic devices. In order to compact the multilayer ceramic wiring board itself, studies are underway to reduce the thickness of the ceramic layers 7 which are components of the wiring board.

As shown in section in FIG. 20, however, the boundary between the circuit element 71 and the ceramic layer 7 in the conventional multilayer ceramic wiring board is likely to become wavy or undulate in the region C indicated although the boundary should originally be straight, such that if the ceramic layer 7 is made thinner, the surface of the circuit element 71 will come into contact with the surface of other circuit element 72 or 72 in the wavy boundary region to make a short circuit.

Further as shown in FIGS. 21 and 22, it is likely that projections 95 will be formed on the surfaces of circuit elements 71 to extend toward other circuit elements 71. In the case where the ceramic layer 7 has a reduced thickness, the outer end of the projection 95 will come into contact with that of the projection 95 formed on the surface of other circuit element 71, giving rise to the problem of causing a short.

SUMMARY OF THE INVENTION

A first object of the present invention is to prevent formation of projections extending from the surfaces of the circuit elements on the multilayer ceramic wiring board. A second object of the invention is to prevent the waviness of the boundary between the circuit element and the ceramic layer in the multilayer ceramic wiring board.

To fulfill these objects, we have conducted intensive research and found that the formation of projections from the circuit elements on the conventional multilayer ceramic wiring board is attributable to the state of the ceramic powder dispersed over the surface of the green sheet and the particle size of the electrically conductive powder contained in the conductive mixture material, and that the wavy boundary between the circuit element and the ceramic layer is attributable to the state of the ceramic powder dispersed throughout the green sheet. With reference to FIG. 23, the surface of the conventional green sheet has interstices 82 formed between the ceramic particles 8 since the ceramic particles 8 are dispersed unevenly. The interstices 82 are filled with the binder resin or solvent. Further with reference to FIG. 24, the conductive mixture material contains the conductive powder 9 comprising particles of varying sizes. The mean particle size of the conductive powder 9 contained in the conductive mixture material was found to be approximately the same as that of the ceramic powder constituting the green sheet. When a pattern of circuit elements was printed on the surface of each green sheet 80 with the conductive mixture material 91 as shown in FIG. 25 in the conventional process for producing the conventional multilayer ceramic wiring board with use of conventional green sheets and the conventional conductive mixture material, it was found that conductive particles 9a of small size were trapped in interstices 82, 82, 82 formed in the surface of the green sheet 80 at the boundary (region D) between the green sheet 80 and the conductive mixture material 91 as shown in FIG. 26. The green sheets 80 each bearing the print of conductive mixture material were then placed over one another into a laminate, which was pressed hot, whereby the interstices in each green sheet were filled with conductive particles 9a of small size as shown in FIG. 27. The conductive particles 9a filling the interstices of the green sheets form projections on the surfaces of the circuit elements obtained by firing the pressed laminate.

The ceramic powder 8 was unevenly dispersed throughout the green sheet used for producing the conventional wiring board as shown in FIG. 26. Accordingly, when the laminate of printed green sheets 80 was pressed hot, compressive stress failed to uniformly act on each green sheet 80, consequently permitting waviness of the surface of the green sheet after hot pressing to undulate the boundary between the circuit element obtained by firing the laminate and the ceramic layer thereof. Especially when small circuit elements 72, 72 were present in the vicinity of the circuit element 71 as shown in FIG. 20, the compressive stress acting on the green sheet when the laminate was pressed hot involved great variations, consequently readily permitting waviness of the boundary between the ceramic layer and the circuit element.

To accomplish the first object, the prevent invention provides a multilayer ceramic wiring board prepared from a plurality of sheets formed from a ceramic-incorporating material containing a ceramic powder and a binder resin and each having a pattern of one or a plurality of circuit elements printed on a surface thereof with use of a conductive mixture material containing an electrically conductive powder and a binder resin, by placing the sheets over one another to form a laminate, and compressing and firing the laminate. The mean particle size Rs of the ceramic powder is not greater than the value of (Rd−σd) wherein Rd is the mean particle size of the conductive powder and σd is the standard deviation obtained when the distribution of the particle sizes of the conductive powder is expressed by a normal distribution function.

The present invention further provides a process for producing the multilayer ceramic wiring board which process has the steps of:

preparing a plurality of green sheets by coating a plastic film with a ceramic-incorporating material containing a ceramic powder and a binder resin and drying the ceramic-incorporating material, forming a hole in at least one of the green sheets through the thickness thereof at least one portion of the sheet, printing a pattern of one or a plurality of circuit elements on a surface of each of the green sheets with use of a conductive mixture material containing an electrically conductive powder and a binder resin, placing over one another the printed green sheets on which the pattern of circuit elements is each printed according to the printing step to form a laminate, compressing the laminate, and firing the compressed laminate to harden the laminate, the mean particle size Rs of the ceramic powder for use in the green sheet preparing step being not greater than the value of (Rd−σd) wherein Rd is the mean particle size of the conductive powder and σd is the standard deviation obtained when the distribution of the particle sizes of the conductive powder is expressed by a normal distribution function.

In the case of the multilayer ceramic wiring board of the invention and the process thereof for producing the wiring board, the distribution of particle sizes of the conductive powder contained in the conductive mixture material can be considered to be in conformity with a normal distribution function. In this case, the particle sizes of about 85% of the whole conductive powder contained in the conductive mixture material are greater than the mean particle size of the ceramic powder. Furthermore, the mean particle size of the conductive powder contained in the conductive mixture material is greater than that of the conductive powder contained in the conventional conductive mixture material. The conductive powder therefore encounters difficulty in entering the interstices formed in the surface of the green sheet in the pattern printing step and the compressing step. Thus, the conductive powder is less likely to fill the interstices in the surface of the green sheet, with the result that the formation of projections extending from the surfaces of circuit elements obtained by the firing step is prevented.

Stated more specifically, the pattern of one or a plurality of circuit elements printed on the surface of each green sheet constituting the laminate forms the circuit element or elements when the laminate is fired, and the value (Rd+2σd) of the conductive powder is not greater than 1/10 of the value Wd which is the minimum line width of the circuit element or elements.

With this specific construction, the particle sizes of about 98% of the whole conductive powder contained in the conductive mixture material are not greater than 1/10 of the minimum line width of the circuit element or elements and are sufficiently small relative to the minimum line width. Accordingly, the print of circuit element pattern formed by the printing step has diminished surface irregularities, making it possible to give the circuit element a line width as designed. As a result, no circuit noise occurs owing to the difference of the line width of the circuit element from the designed value.

Further stated more specifically, the value (Rd+2σd) of the conductive powder is not greater than 10 μm, and is more preferably not greater than 5 μm.

According to this feature, about 98% of the whole conductive powder contained in the conductive mixture material comprises particles of up to 10 μm in size which are sufficiently small as compared with the line width (about 100 μm) of usual circuit elements. As a result, the print of circuit element pattern obtained by the pattern printing step has diminished surface irregularities. Especially in the case where about 98% of the whole conductive powder contained in the conductive mixture material is up to 5 μm in particle size, the particle sizes of the conductive powder are much smaller than the usual line width (about 100 μm) of circuit elements, so that the print of circuit element pattern resulting from the pattern printing step has almost no surface irregularities. The circuit elements obtained by the firing step are therefore arranged at a spacing of designed value (so-called line pitch).

To accomplish the foregoing second object, the present invention provides another process for producing the multilayer ceramic wiring board which process has the steps of:

preparing a plurality of green sheets by coating a plastic film with a ceramic-incorporating material containing a ceramic powder and a binder resin and drying the ceramic-incorporating material, a preliminary pressing step of compressing the green sheets obtained by the green sheet preparing step in the direction of the thickness thereof, forming a hole in at least one of the green sheets through the thickness thereof at least one portion of the sheet, printing a pattern of one or a plurality of circuit elements on a surface of each of the green sheets with use of a conductive mixture material containing an electrically conductive powder and a binder resin, placing over one another the printed green sheets on which the pattern of circuit elements is each printed according to the printing step to form a laminate, compressing the laminate, and firing the compressed laminate to harden the laminate, the mean particle size Rs of the ceramic powder for use in the green sheet preparing step being not greater than the value of (Rd−σd) wherein Rd is the mean particle size of the conductive powder and σd is the standard deviation obtained when the distribution of the particle sizes of the conductive powder is expressed by a normal distribution function.

The green sheets are compressed in the direction of thickness thereof by the preliminary pressing step of the process of the invention, so that the ceramic powder in the green sheets is made almost free from interstices. The preliminary pressing step further smooths the surface irregularities of the green sheets, rendering the surfaces of the green sheets substantially planar. Accordingly, the green sheets remain almost uncompressed by the compressing step to produce no waviness in their surfaces, whereby the boundary between each green sheet and the conductive mixture material is made approximately planar. As a result, the circuit elements resulting from the firing step have an approximately planar boundary with the ceramic layer.

The preliminary pressing step almost completely eliminates interstices from the ceramic powder in the green sheets, with the result that the surfaces of the green sheets are almost free from interstices. Furthermore, the distribution of particles sizes of the conductive powder contained in the conductive mixture can be considered to be in conformity with the normal distribution function. In this case, the particle sizes of about 85% of the whole conductive powder contained in the conductive mixture material are greater than the mean particle size of the ceramic powder. Furthermore, the mean particle size of the conductive powder contained in the conductive mixture material is greater than that of the conductive powder contained in the conventional conductive mixture material. The conductive powder therefore encounters difficulty in entering the interstices in the surface of the green sheet. This prevents the formation of projections on the surfaces of the circuit elements obtained by the firing step.

Stated more specifically, the green sheets resulting from the preliminary pressing step have an arithmetic average surface roughness Ra which is not greater than $1/20$ of the value Rs. The arithmetic average surface roughness is defined in JIS B 0601 and represented by Ra.

With this feature, the arithmetic average surface roughness Ra of the green sheets obtained by the preliminary pressing step is not greater than $1/20$ of the mean particle size Rs of the ceramic powder used in the green sheet preparing step, and the green sheets obtained from the preliminary pressing step have a substantially planar surface.

As described above, the multilayer ceramic wiring board of the invention and the process thereof for producing the wiring board are adapted to prevent formation of projections extending from the surfaces of circuit elements and also to prevent undulation of the circuit elements.

DETAILED DESCRIPTION OF EMBODIMENTS

Embodiments of the present invention will be described below with reference to the drawings.

First Embodiment

Figure 1:
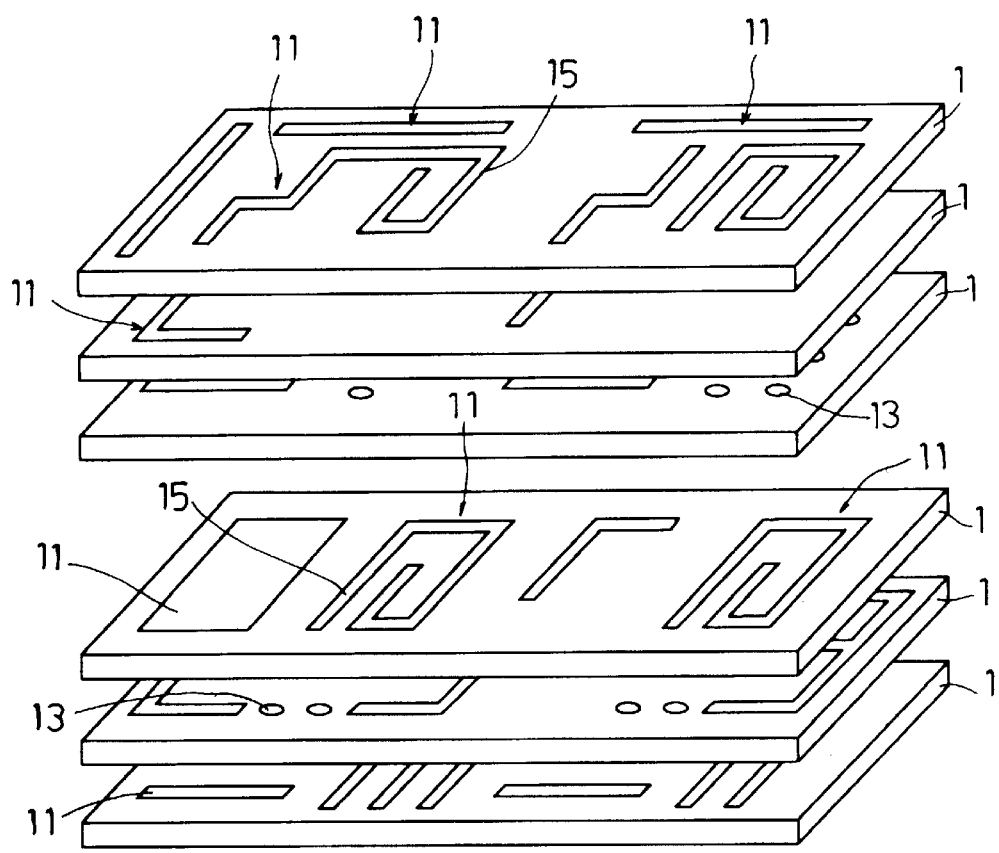
FIG. 1 is an exploded perspective view showing the laminate structure of a multilayer ceramic wiring board embodying the invention.

Like the conventional multilayer ceramic wiring board, the multilayer ceramic wiring board of the present embodiment comprises a plurality of superposed ceramic layers. As shown in FIG. 1, each ceramic layer 1, about 20 $\mu$m in thickness, has a plurality of circuit elements 11 formed on a surface thereof. A via hole 13 is formed in the specified ceramic layer 1 for establishing electrical continuity with the circuit element 11 provided on the surface of another one of the ceramic layers 1. The plurality of circuit elements 11 are electrically connected by the via hole 13 to provide a capacitor or inductor and thereby constitute an electronic circuit such as a filter. The straight lines 15 providing the circuit elements 11 are about 100 $\mu$m in width.

Figure 2:
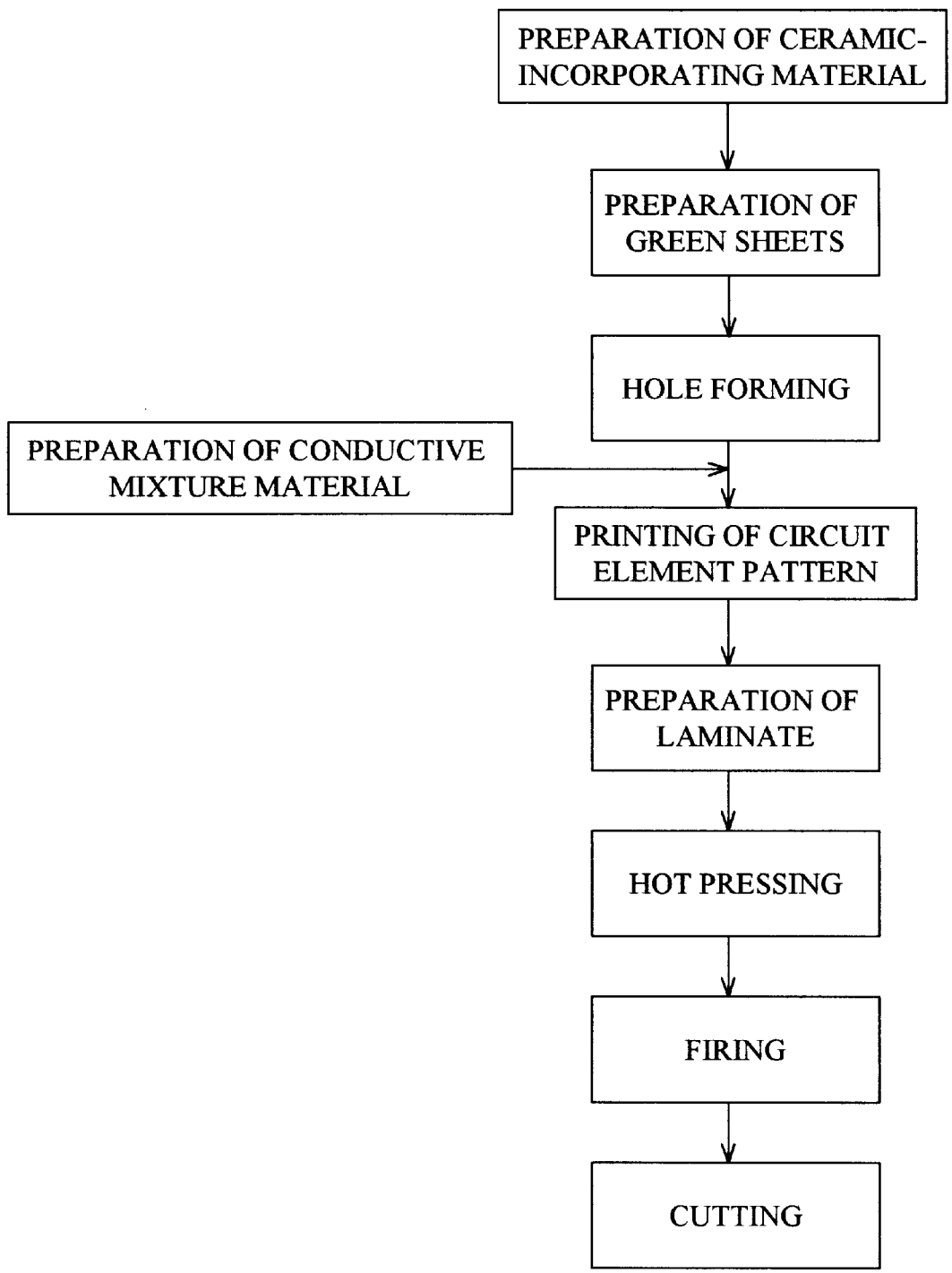
FIG. 2 is a process diagram showing a process for producing the multilayer ceramic wiring board.

The multilayer ceramic wiring board of the present embodiment is produced by the process to be described below with reference to the process diagram of FIG. 2.

First in the step of preparing a ceramic-incorporating material, a roll mill is used for agitating a ceramic powder so classified as to range from 0.5 to 5.0 $\mu$m in particle size and to have a mean particle size of 1.0 $\mu$m, a binder resin comprising polyvinyl alcohol and polyvinylidene fluoride, and a solvent comprising toluene and an alcohol to prepare the ceramic-incorporating material.

Figure 3:
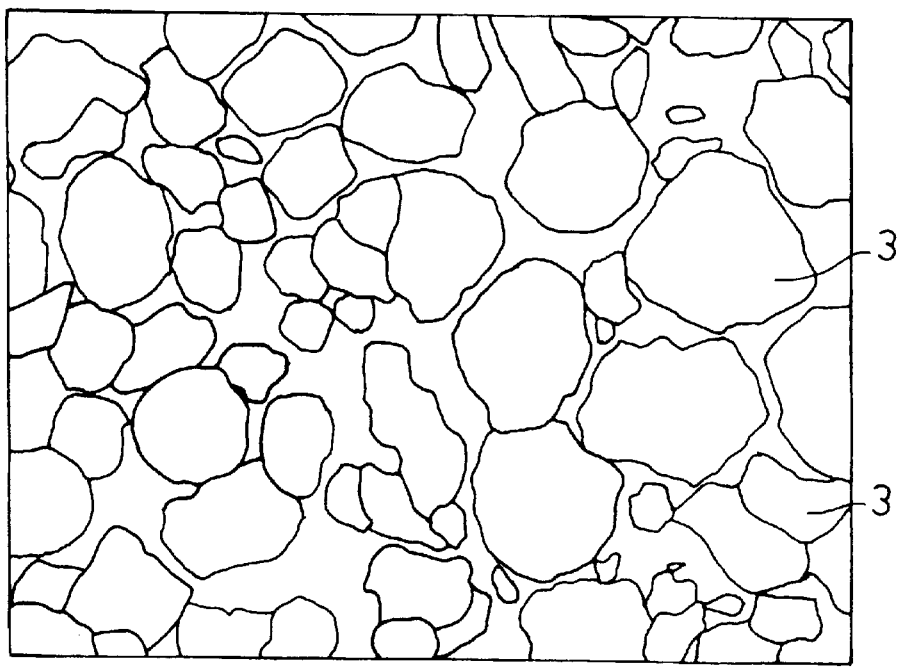
FIG. 3 is a sketch showing a conductive powder for use in producing the wiring board, as observed under an electron microscope.

In a conductive mixture material preparing step, a conductive mixture material is prepared by mixing together a conductive powder of silver, binder resin and solvent. As shown in FIG. 3, the conductive powder of silver is so classified as to range from 1 $\mu$m to 5 $\mu$m in particle size and to have a mean particle size of 3.2 $\mu$m. The distribution of particle sizes of this powder can be considered to be in conformity with a normal distribution function, and the standard deviation is 1.3 $\mu$m in this case. Accordingly, about 85% of the conductive powder 3 contained in the conductive mixture material is greater in particle size than 1.0 μm which is the mean particle size of the ceramic powder. Incidentally, the conductive powder contained in the conventional conductive mixture material had particle sizes in the range of 0.5 μm to 3 μm and a mean particle size of 1.8 μm.

Figure 4:
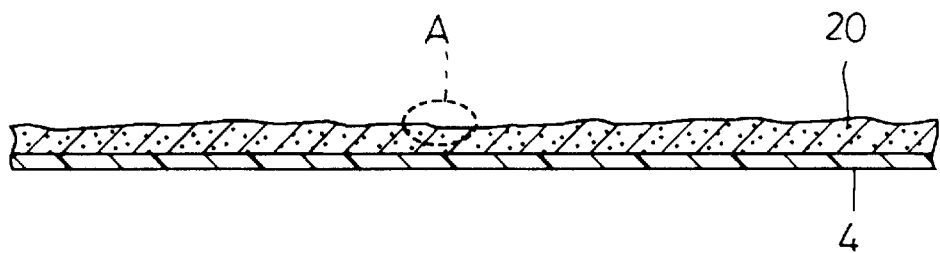
FIG. 4 is a diagram in section showing a green sheet preparing step in producing the wiring board.
Figure 5:
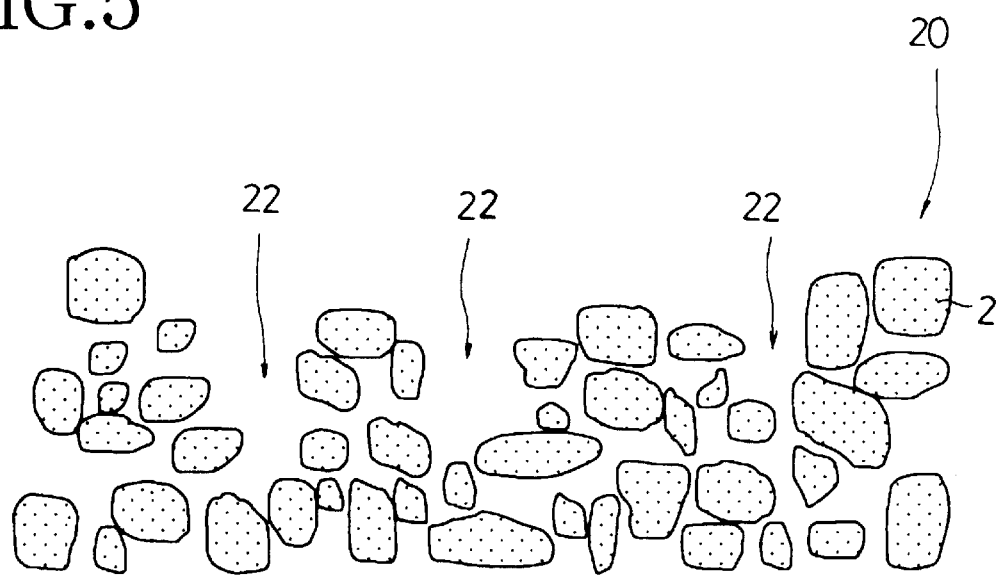
FIG. 5 is an enlarged view in section schematically showing the region A in FIG. 4.

In a green sheet preparing step, the ceramic-incorporating material prepared in the form of a slurry in advance is applied in the form of a sheet to a surface of a plastic film 4 with a doctor blade as shown in FIG. 4 and then dried to obtain a sheet, which is thereafter cut to a predetermined size to prepare a plurality of green sheets 20 comprising the ceramic-incorporating material. With reference to FIG. 5, the green sheet 20 prepared by the above step has many interstices 22, 22, 22 formed in its surface (region A), and the interstices 22 are filled with the binder resin dissolved in the solvent.

In a hole forming step, the plastic film is removed from each green sheet obtained by the green sheet preparing step, and a via hole is formed in the green sheet at a predetermined position.

Figure 6:
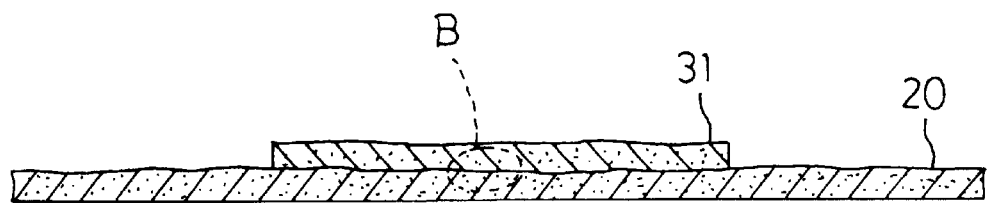
FIG. 6 is a diagram in section for illustrating a pattern printing step in producing the wiring board.
Figure 7:
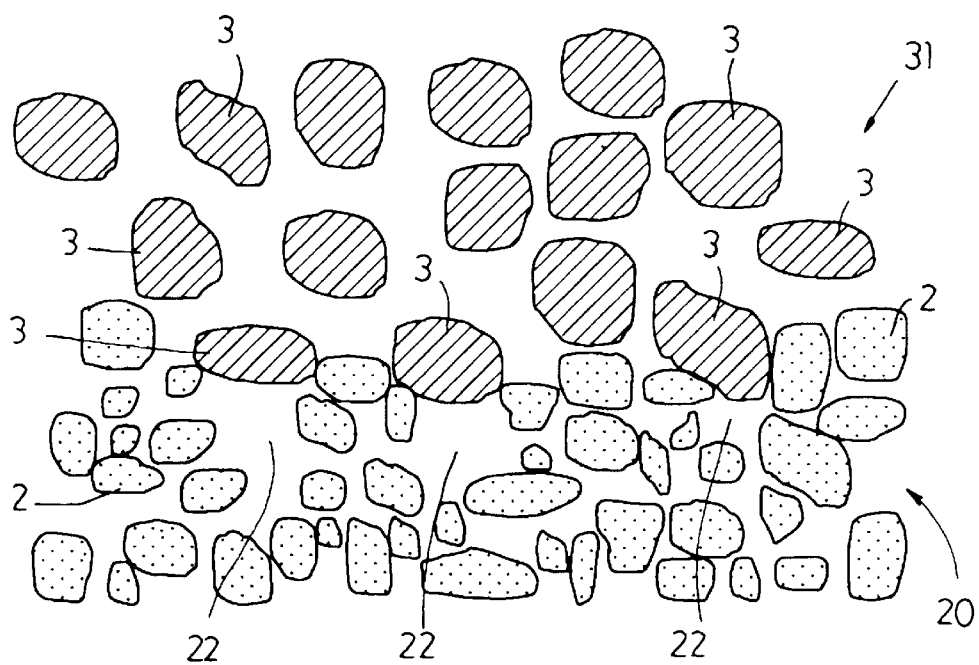
FIG. 7 is an enlarged view in section schematically showing the region B in FIG. 6.

With reference to FIG. 6, the conductive mixture material 31 prepared in the form of a slurry in advance is used in a pattern printing step to print a pattern of circuit elements on the surface of each green sheet 20 by screen printing. About 85% of the conductive powder contained in the conductive mixture material 31 has particle sizes which are greater than the mean particle size (1.0 μm) of the ceramic powder. The mean particle size of the conductive powder contained in the mixture material is greater than that of the conductive powder contained in the conventional conductive mixture material. Accordingly, the conductive powder encounters difficulty in entering the interstices 22, 22, 22 formed in the surface of the green sheet 20 at the boundary between the green sheet 20 and the mixture material 31 (region B) as seen in FIG. 7.

In a laminate preparing step, the green sheets each having the pattern of circuit elements printed thereon are placed over one another to prepare a laminate.

In a compressing step, the laminate obtained by the laminate preparing step is pressed hot and consolidated. About 85% of the conductive powder contained in the conductive mixture material 31 has particle sizes greater than the mean particle size (1.0 μm) of the ceramic powder, and the conductive powder contained in the mixture material is greater than the conductive powder of the conventional conductive mixture material in mean particle size, so that the conductive powder 3 encounters difficulty in filling the interstices formed in the surface of the green sheet 20 as shown in FIG. 8.

In a firing step, the pressed laminate is fired and thereby hardened. Finally, the laminate resulting from the firing step is cut into individual multilayer ceramic wiring boards in a cutting step.

Figure 9:
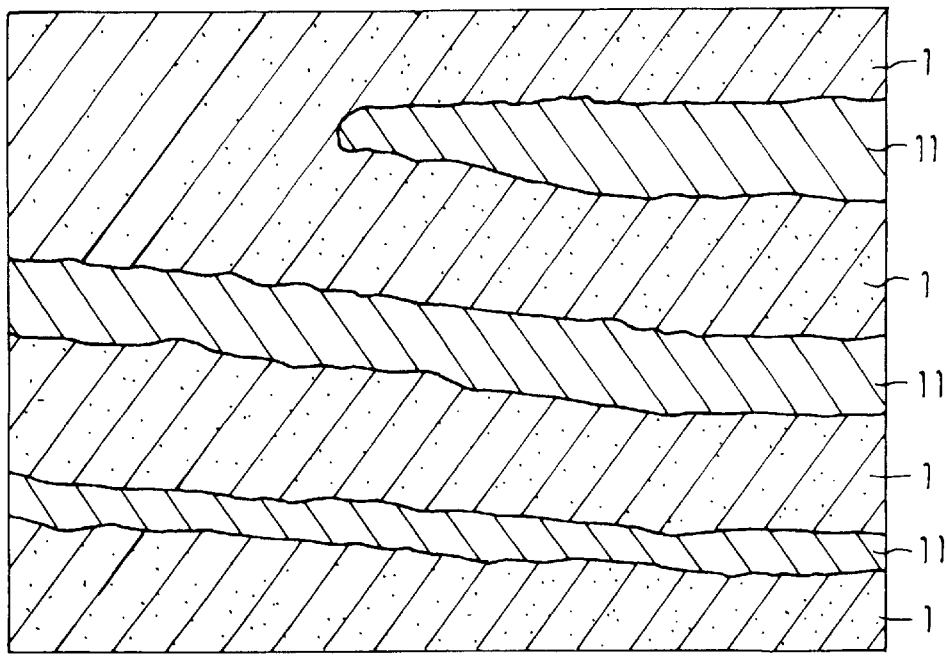
FIG. 9 is an enlarged view in section of the wiring board.
Figure 10:
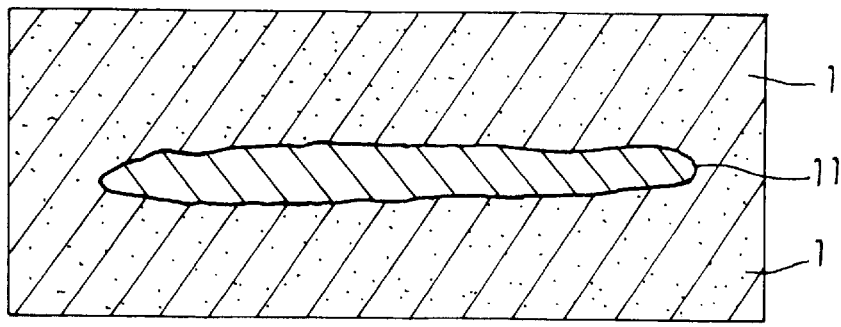
FIG. 10 is another enlarged view in section of the wiring board.

In the case of the multilayer ceramic wiring board of the present embodiment and the process for producing the board, it is difficult for the conductive powder to enter the interstices formed in the surface of the green sheet in the pattern printing step, and the conductive powder encounters difficulty in filling the interstices in the green sheet in the compressing step, so that the circuit elements resulting from the firing step are less likely to have projections on their surfaces and are smooth-surfaced as seen in FIGS. 9 and 10. This obviates the likelihood of a short-circuit occurring between the circuit elements even if the ceramic layers are given a smaller thickness than those of the conventional multilayer ceramic wiring board.

Figure 8:
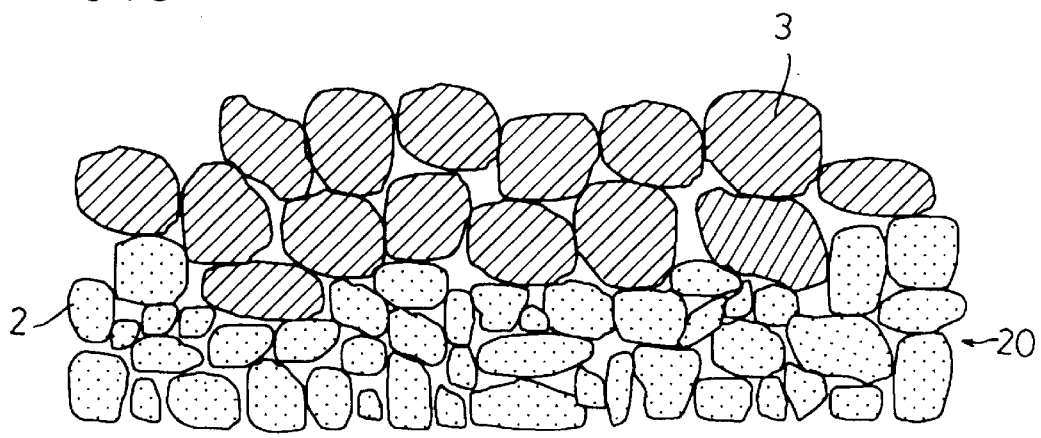
FIG. 8 is an enlarged view in section schematically showing the region B after a compressing step.

The binder resin or solvent filling the interstices in the ceramic powder is not shown in FIGS. 5, 7 and 8, with the binder resin or solvent filling the interstices in the conductive powder also omitted from these drawings.

The particle sizes of the conductive powder for use in producing the multilayer ceramic wiring board of the present embodiment are up to 5 μm, not greater than 10% (about 10 μm) of the line width (about 100 μm) of the circuit elements, and sufficiently small relative to the circuit element line width. This renders the pattern of the circuit elements produced by screen printing free from surface irregularities, making it possible to give the circuit elements obtained from the firing step a line width as designed and consequently obviating occurrence of circuit noise due to the difference of the circuit element line width from the designed value.

Because the lines of circuit elements are free from surface irregularities, and because each pair of lines which are arranged close to each other are spaced apart by a distance (so-called line pitch) as designed, there is no likelihood of a short-circuit occurring between the lines.

Second Embodiment

The multilayer ceramic wiring board of this embodiment has the same construction as the multilayer ceramic wiring board of the first embodiment shown in FIG. 1, and will not be described.

Figure 11:
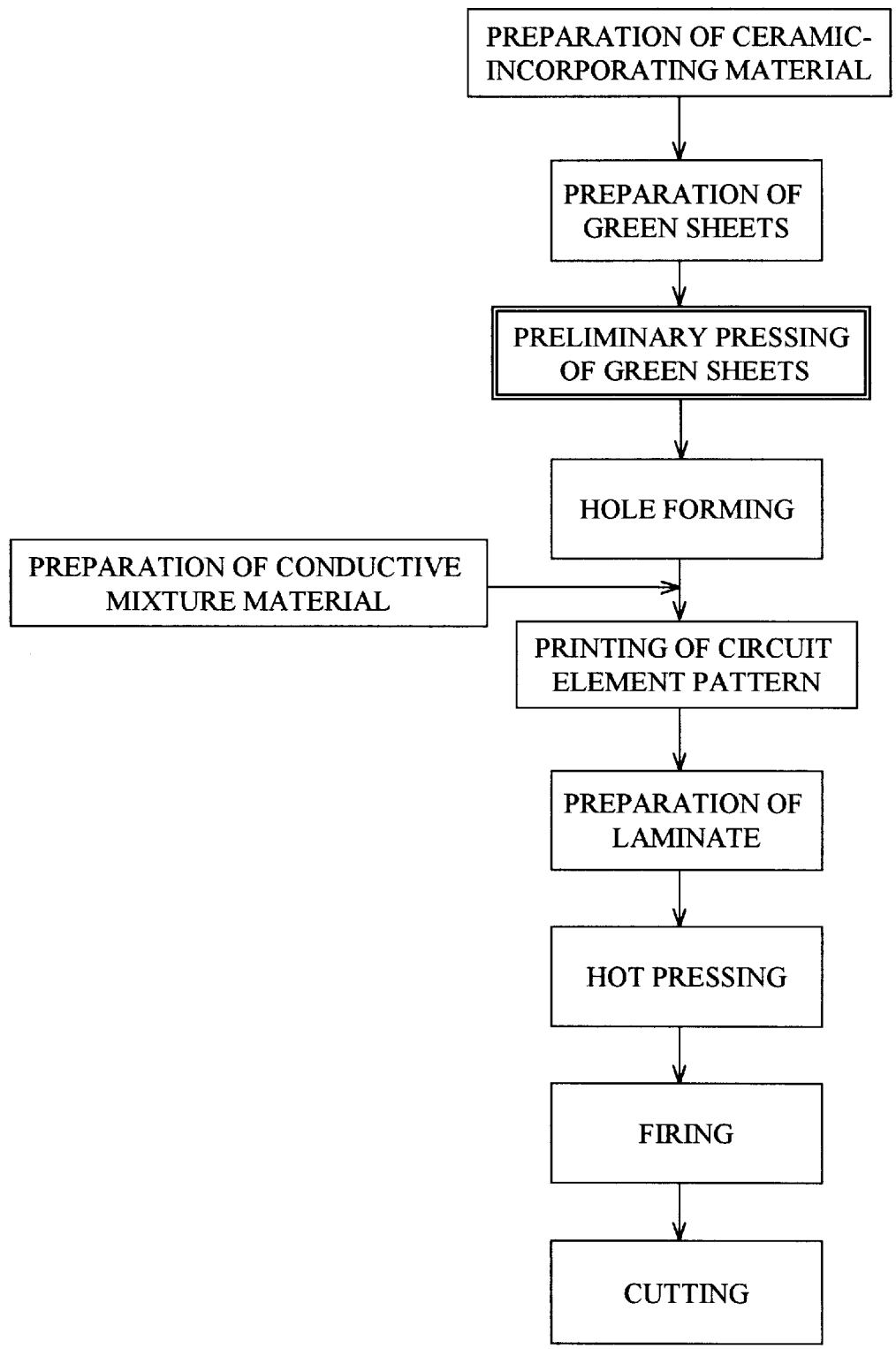
FIG. 11 is a process diagram showing another process for producing a multilayer ceramic wiring board of the invention.

The multilayer ceramic wiring board of the present embodiment is produced by a process comprising the steps shown in FIG. 11. The process for the present wiring board differs from the process for producing the wiring board of the first embodiment in that the process for the present board has a preliminary pressing step between the green sheet preparing step of the process for the first embodiment and the hole forming step thereof.

In the process for producing the multilayer ceramic wiring board of the present embodiment, a plurality of green sheets are prepared in the same green sheet preparing step as for the first embodiment.

Figure 12:
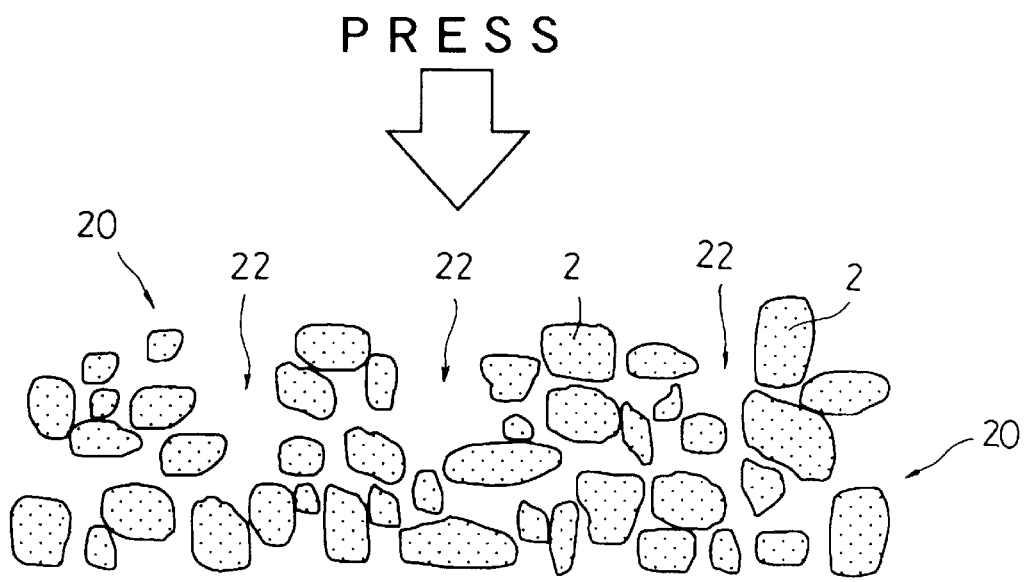
FIG. 12 is an enlarged view in section schematically showing the surface of a green sheet for use in producing the wiring board.
Figure 13:
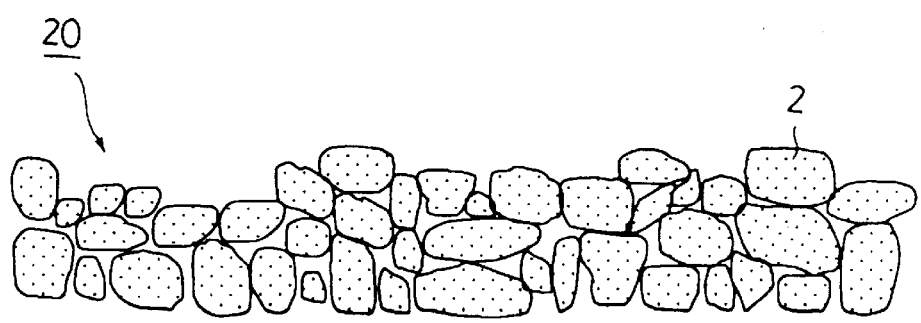
FIG. 13 is an enlarged view in section schematically showing the surface of the green sheet after a preliminary pressing step.
Figure 14:
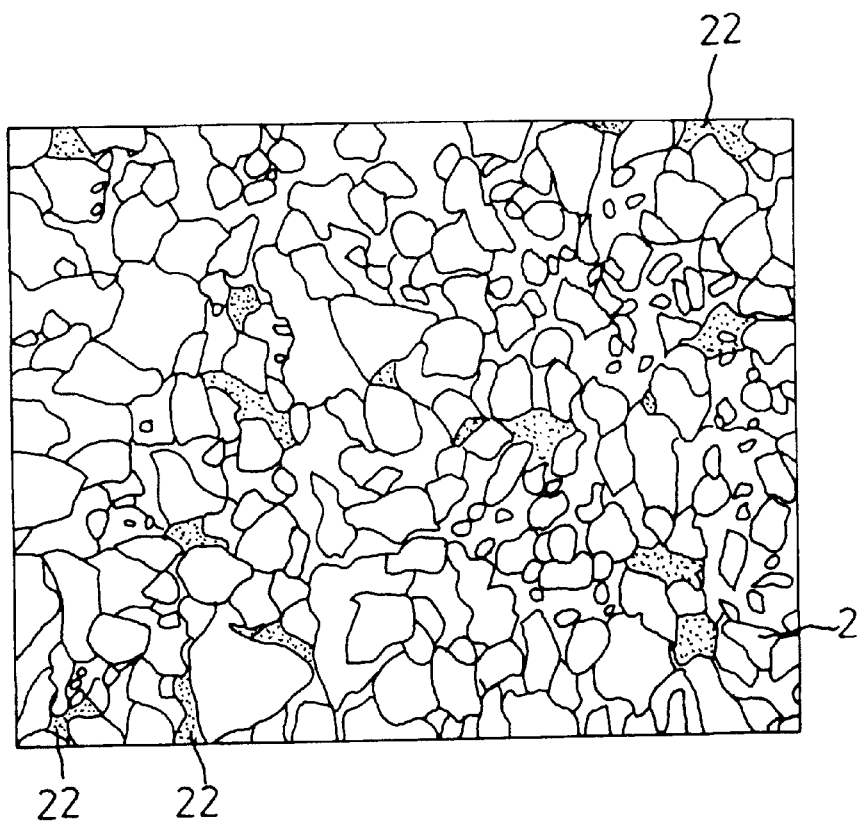
FIG. 14 is a sketch showing the surface of the green sheet as observed under an electron microscope.
Figure 23:
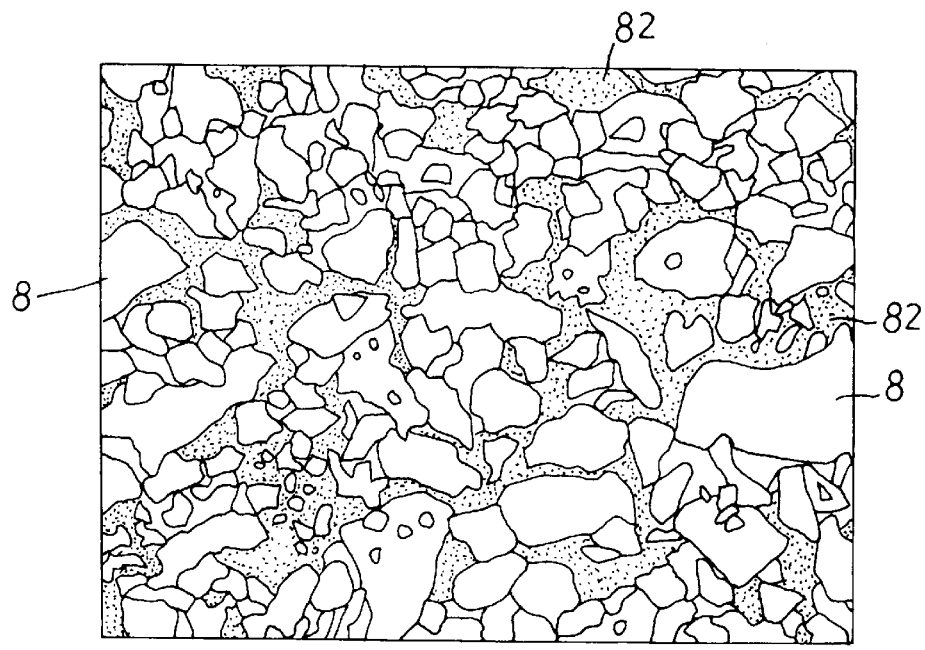
FIG. 23 is a sketch showing the surface of a green sheet for use in producing the wiring board, as observed under an electron microscope.
Figure 24:
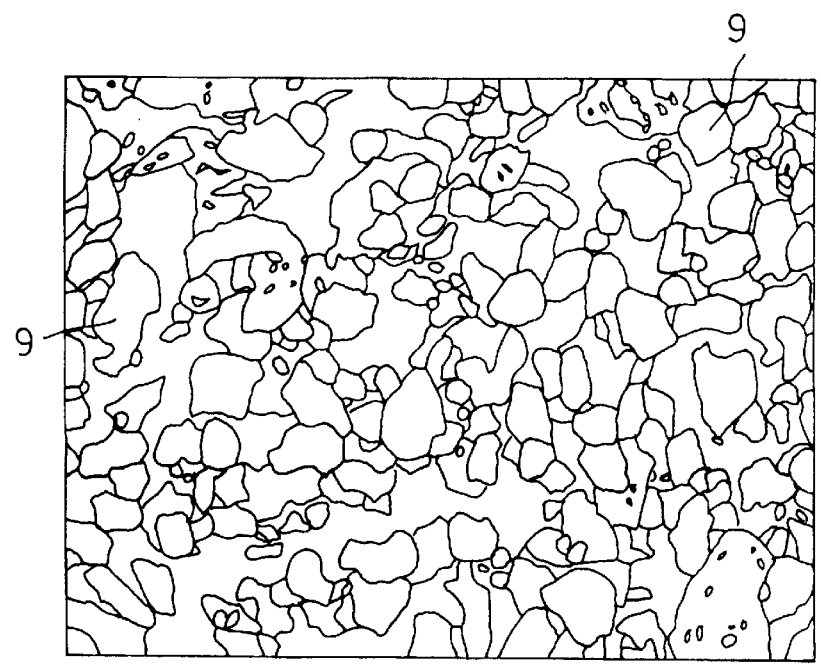
FIG. 24 is a sketch showing an electrically conductive powder for use in producing the wiring board, as observed under an electron microscope.
Figure 25:
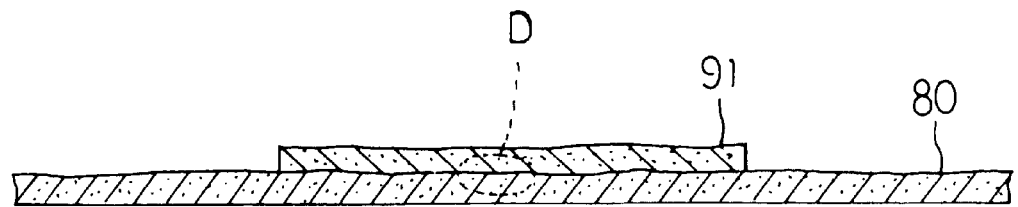
FIG. 25 is a sectional view showing the green sheet with a conductive mixture material printed on the surface thereof in producing the wiring board.
Figure 26:
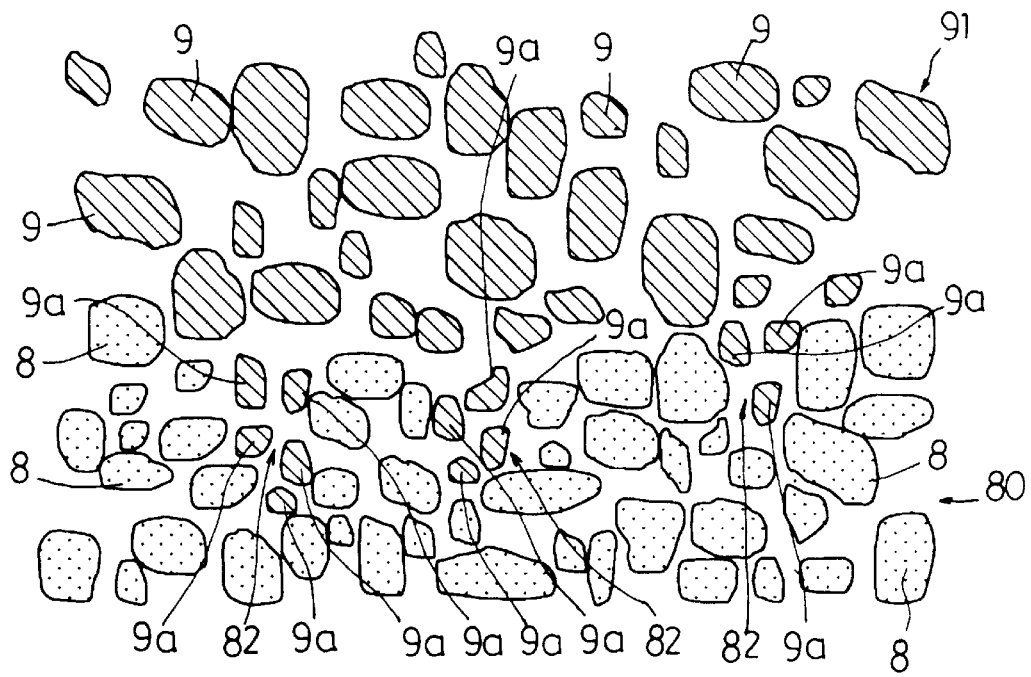
FIG. 26 is an enlarged view in section schematically showing the region D of FIG. 25.
Figure 27:
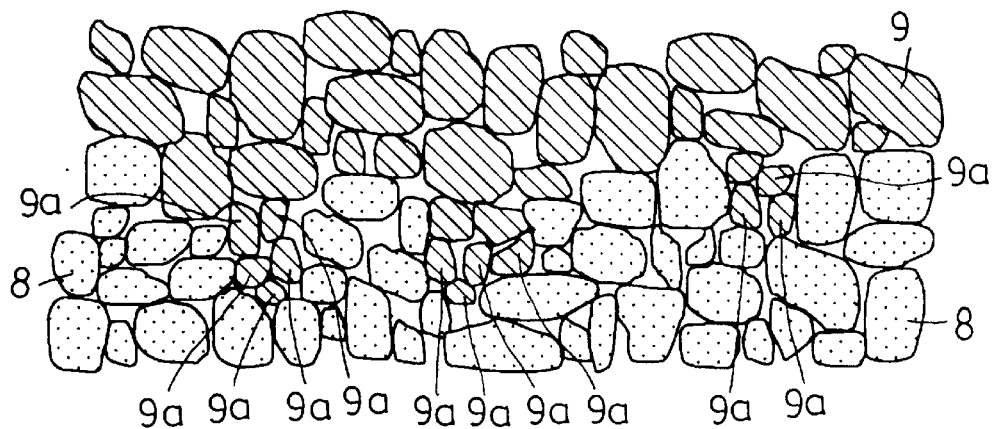
FIG. 27 is an enlarged view in section schematically showing the region D after a compressing step.

In the preliminary pressing step for the green sheets, the green sheet 20 having interstices 22, 22, 22 formed in its surface is compressed under a pressure of 200 kg/cm$^2$ in the direction of the thickness thereof as shown in FIG. 12 by a roll press. The preliminary pressing step diminishes the spaces between the ceramic particles 2 dispersed throughout the green sheet 20 as shown in FIG. 13 to eliminate the interstices almost completely. Moreover, this step smooths the surface irregularities of the green sheet 20, making the surface of the sheet 20 substantially planar. Consequently, as shown in FIG. 14, the opening areas of the interstices 22 formed in the surface of the green sheet 20 are much smaller than those (see FIG. 23) of the interstices formed in the surface of the conventional green sheet.

In the hole forming step, a via hole is formed in each green sheet at a predetermined position as in the hole forming step for the first embodiment.

Figure 15:
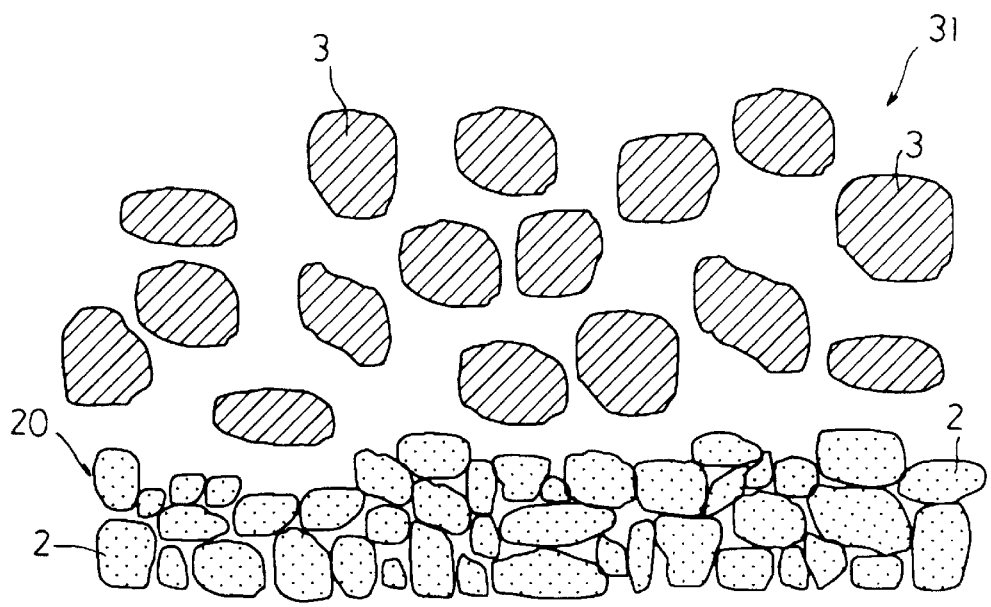
FIG. 15 is an enlarged view in section schematically showing the portion of the green sheet in contact with a conductive mixture material printed on the surface of the green sheet.

With reference to FIG. 15, a conductive mixture material 31 is used in the pattern printing step to print a pattern of circuit elements on the surface of each green sheet 20 resulting from the preliminary pressing step. The opening areas of the interstices in the surface of the green sheet 20 are much smaller than those of the interstices in the surface of the conventional green sheet. Further about 85% of the conductive powder 3 contained in the conductive mixture material 31 has particle sizes which are greater than the mean particle size (1.0 μm) of the ceramic powder. In addition, the mean particle size of the conductive powder 3 contained in the mixture material is greater than that of the conductive powder contained in the conventional conductive mixture material. Accordingly, the conductive powder 3 encounters difficulty in entering the inside of the green sheet 20 through the interstices in the surface of the green sheet 20.

In the lamination step, the green sheets each having the pattern of circuit elements printed thereon are placed over one another to prepare a laminate as in the lamination step for the first embodiment.

Figure 16:
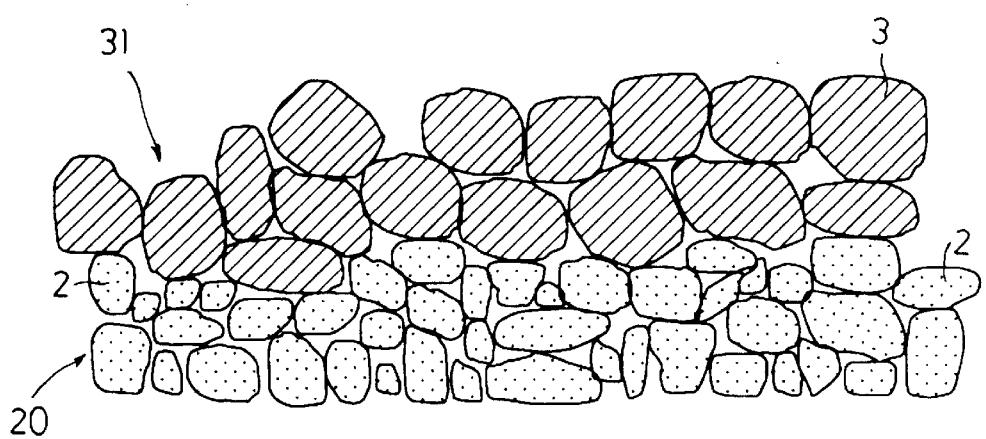
FIG. 16 is an enlarged view in section schematically showing the contact portion after a compressing step.

In the compressing step, the laminate obtained by the lamination step is pressed hot and consolidated. The green sheets 20 already compressed by the preliminary pressing step remain undeformed by the compressing step, permitting the conductive mixture material 31 only to be compressed as seen in FIG. 16.

In the firing step, the laminate from the compressing step is fired in the same manner as by the firing step for the first embodiment.

The laminate resulting from the firing step is cut in the cutting step in the same manner as by the same step as for the first embodiment to obtain multilayer ceramic wiring boards.

Figure 17:
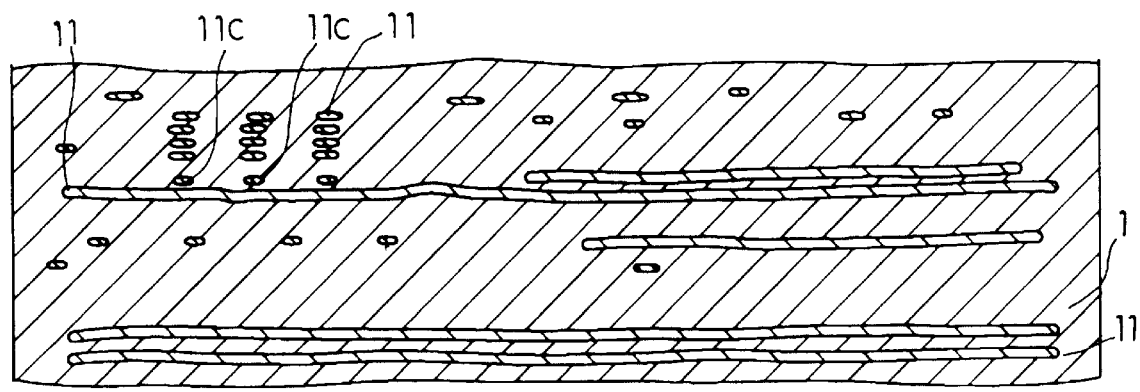
FIG. 17 is a sectional view of the wiring board embodying the invention.

In the case of the process for producing the multilayer ceramic wiring board of the present embodiment, the green sheets 20 resulting from the compressing step have a generally planar surface, and the boundary between the green sheet 20 and the conductive mixture material 31 is substantially planar after the compressing step. The boundary between the circuit element obtained after the firing step and the ceramic layer is therefore substantially planar. As a result, the boundary between the ceramic layer 1 and the circuit element 11 formed in the vicinity of small circuit elements 11c, 11c is generally straight and is not wavy in the section of the wiring board as seen in FIG. 17. This eliminates the likelihood that the surface of the circuit element 11 will come into contact with the surface of other circuit element 11c to cause a short if the ceramic layer 1 is given a smaller thickness than in the conventional multilayer ceramic wiring board.

Furthermore, the opening areas of the interstices formed in the surface of the green sheet by the preliminary pressing step are smaller than those of the interstices formed in the surface of the conventional green sheet, making it difficult for the conductive powder to ingress into and fill the interstices in the green sheet surface in the compressing step. This prevents formation of projections extending from the surface of the circuit element, consequently obviating the likelihood of a short-circuit occurring between the circuit elements even if the ceramic layer is given a smaller thickness than in the conventional multilayer ceramic wiring board.

Incidentally, the binder resin or solvent filling the interstices in the ceramic powder is not shown in FIGS. 12 and 13. The binder resin or solvent filling the interstices in the ceramic powder is not shown in FIGS. 15, and 16, with the binder resin or solvent filling the interstices in the conductive powder also omitted from these drawings.

[Experiment]

In order to substantiate the effect of the step of preliminarily pressing the green sheets of the present embodiment, the surface of the green sheet was checked for a profile curve before and after the preliminary pressing step by the method prescribed in Japan Industrial Standards (JIS B 0651) to calculate the arithmetic average surface roughness (Ra) based on the profile curves obtained.

Figure 18:
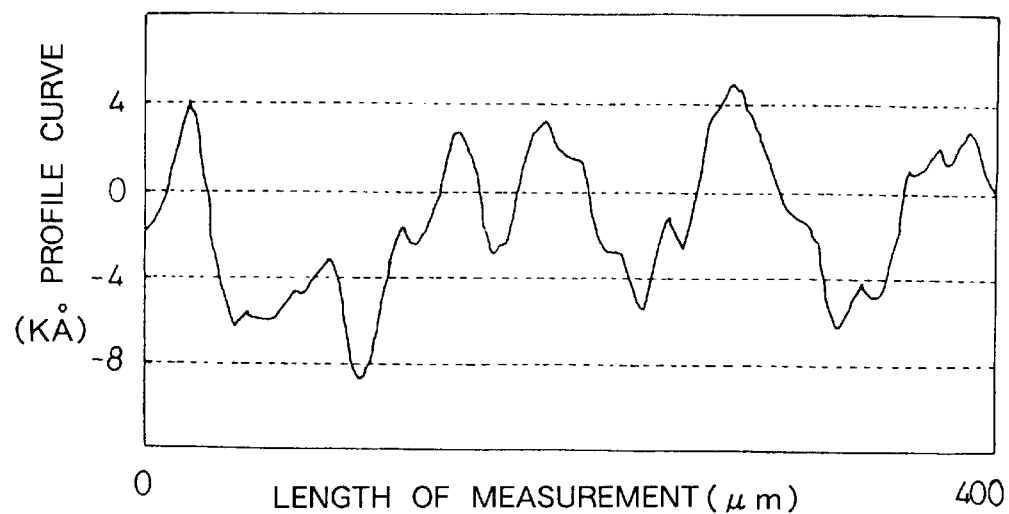
FIG. 18(a) shows a profile curve of the surface of the green sheet before the preliminary pressing step.
FIG. 18(b) shows a profile curve of the surface of the green sheet after the preliminary pressing step.
Figure 18:
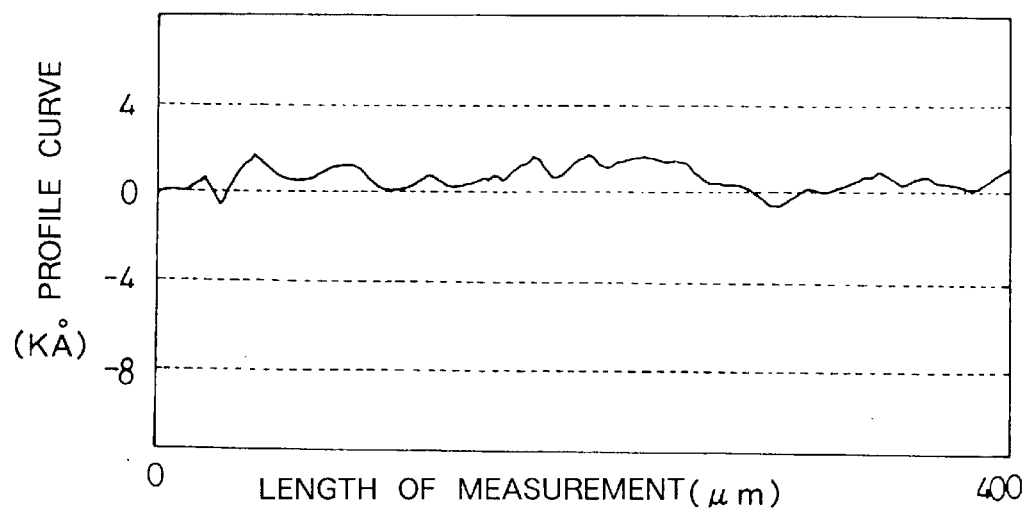
Figure 19:
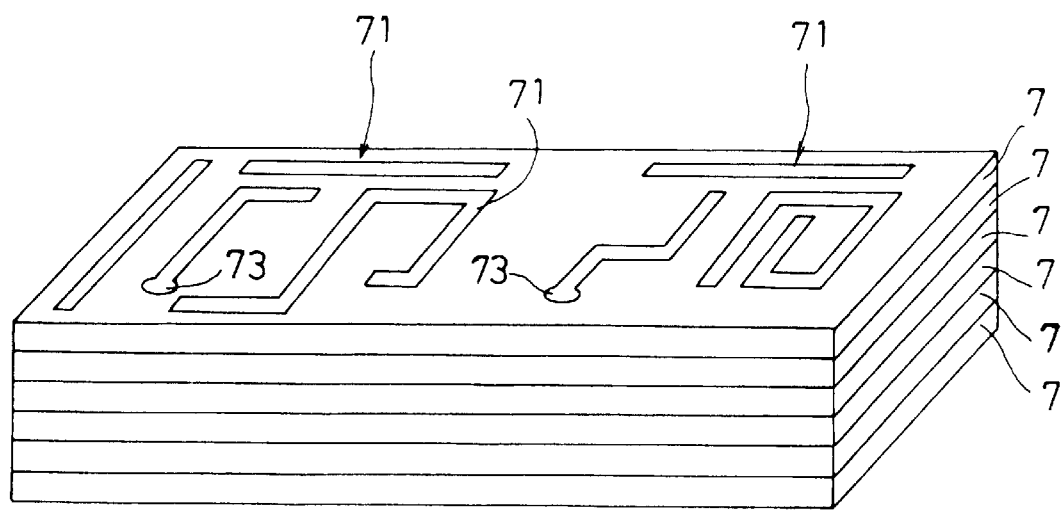
FIG. 19 is a perspective view of a conventional multilayer ceramic wiring board.
Figure 20:
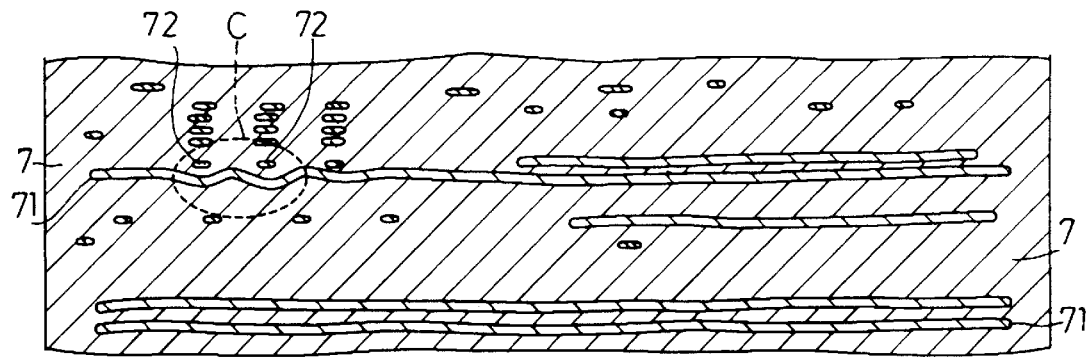
FIG. 20 is a sectional view of the wiring board.
Figure 21:
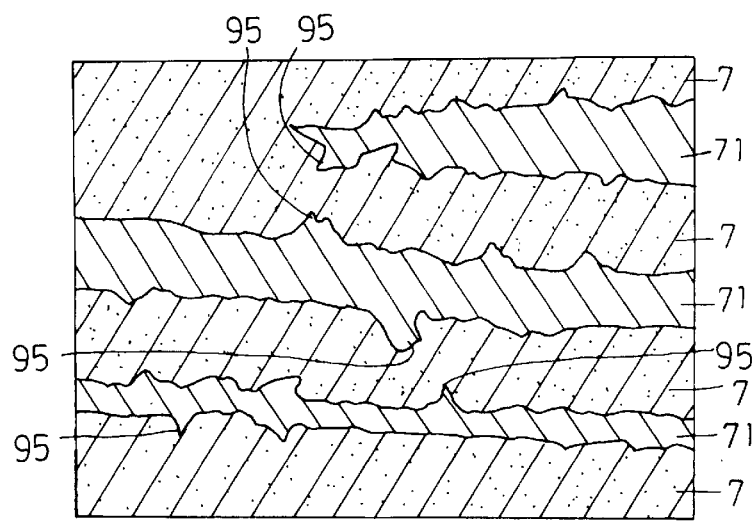
FIG. 21 is an enlarged view in section of the wiring board.
Figure 22:
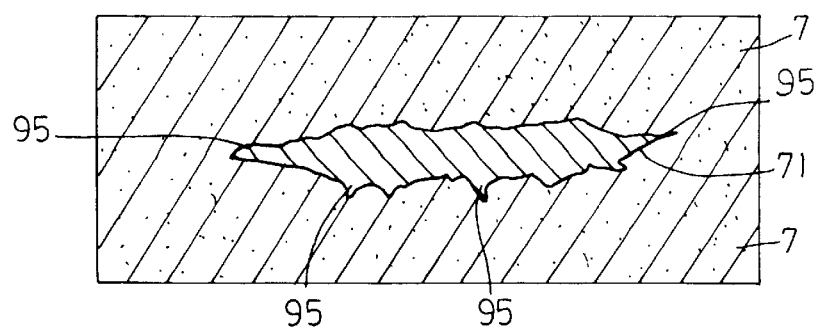
FIG. 22 is another enlarged view in section of the wiring board.

The profile curve of the green sheet surface before the preliminary pressing step is shown in FIG. 18($a$), and the profile curve thereof after the preliminary pressing step in FIG. 18 ($b$). A comparison between these profile curves indicates that the preliminary pressing step gives greatly increased smoothness to the green sheet surface. Table 1 shows the values of arithmetic average surface roughness (Ra) calculated based on the profile curves.

TABLE 1

| Measuring condition | Before pre-pressing | After pre-pressing |
|---|---|---|
| Roughness (Ra) [μm] | 0.29 | 0.05 |

The result shown in Table 1 indicates that the preliminary pressing step improved the surface roughness of the green sheet.

The experimental result also reveals that when the value of arithmetic average surface roughness (Ra, 0.05 μm in the present embodiment) of the green sheet resulting from the preliminary pressing step is not greater than 1/20 of the value of mean particle size (Rs, 1.0 μm in the present embodiment) of the ceramic powder forming the green sheet, the green sheet can be fully compressed to become smooth-surfaced, with the result that the boundary between the circuit element of the wiring board and the ceramic layer thereof has no waviness.

The present invention is not limited to the foregoing embodiments in construction or feature but can be modified variously by one skilled in the art without departing from the spirit of the invention as set forth in the appended claims. For example, a conductive powder of silver was used as the conductive powder to be contained in the conductive mixture material according to the foregoing embodiments, whereas the same advantages as above are available also by using other known conductive powders.

Although a roll press was used for compressing the green sheets in the preliminary pressing step, other known compressing means is also usable such as a flat-plate mechanical press, isostatic press or the like. The same advantages as above can be obtained also in this case.

What is claimed is:

1. A multilayer ceramic wiring board prepared from a plurality of sheets formed from a ceramic-incorporating material containing a ceramic powder and a binder resin and each having a pattern of one or a plurality of circuit elements printed on a surface thereof with use of a conductive mixture material containing an electrically conductive powder and a binder resin, by placing the sheets over one another to form a laminate, and compressing and firing the laminate, the multilayer wiring board wherein a mean particle size of the ceramic powder is not greater than a value of a mean particle size (Rd) of the conductive powder and less a standard deviation (σd) obtained when the distribution of the particle sizes of the conductive powder is expressed by a normal distribution function.

2. A multilayer ceramic wiring board according to claim 1 wherein the pattern of one or a plurality of circuit elements printed on the surface of each sheet constituting the laminate forms the circuit element or elements when the laminate is fired, and a value (Rd+2σd) of the conductive powder is not greater than 1/10 of a minimum line width of the circuit element or elements.

3. A multilayer ceramic wiring board according to claim 1 wherein a value (Rd+2σd) of the conductive powder is not greater than 10 μm.

4. A multilayer ceramic wiring board according to claim 1 wherein a value (Rd+2σd) of the conductive powder is not greater than 5 μm.

* * * * *